United States Patent
Lien et al.

(10) Patent No.: US 6,333,524 B1
(45) Date of Patent: Dec. 25, 2001

(54) ELECTRICALLY PROGRAMMABLE INTERLEVEL FUSIBLE LINK FOR INTEGRATED CIRCUITS

(75) Inventors: Chuen-Der Lien, Los Altos Hills; Anita M. Hansen, Los Altos; David J. Pilling, Los Altos Hills, all of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/342,018

(22) Filed: Jun. 28, 1999

Related U.S. Application Data

(62) Division of application No. 08/870,333, filed on Jun. 6, 1997, now Pat. No. 5,949,127.

(51) Int. Cl.[7] .................................................. H01L 27/10
(52) U.S. Cl. ............................ 257/209; 257/529; 257/530
(58) Field of Search .................................. 257/529, 209, 257/530

(56) References Cited

U.S. PATENT DOCUMENTS

| | | | |
|---|---|---|---|
| 4,045,310 | 8/1977 | Jones et al. | 204/129.4 |
| 4,446,534 | 5/1984 | Smith | 365/96 |
| 4,494,135 | 1/1985 | Moussie | 357/59 |
| 4,562,454 | 12/1985 | Schultz et al. | 357/51 |
| 4,592,025 * | 5/1986 | Takemae et al. | 365/200 |
| 4,723,155 | 2/1988 | Uchida | 357/51 |
| 4,814,853 | 3/1989 | Uchida | 357/51 |
| 4,823,320 * | 4/1989 | Smayling et al. | 365/189 |
| 4,862,243 | 8/1989 | Welch et al. | 357/51 |
| 5,241,496 | 8/1993 | Lowrey et al. | 365/96 |
| 5,298,784 | 3/1994 | Gambino et al. | 257/529 |
| 5,331,196 | 7/1994 | Lowrey et al. | 257/529 |
| 5,376,820 * | 12/1994 | Crafts et al. | 257/529 |
| 5,387,812 | 2/1995 | Forouhi et al. | 257/530 |
| 5,389,814 | 2/1995 | Srikrishnan et al. | 257/529 |
| 5,451,810 | 9/1995 | Tigelaar et al. | 257/530 |
| 5,465,004 | 11/1995 | Lim et al. | 257/529 |
| 5,469,379 * | 11/1995 | Levy | 257/530 |
| 5,493,144 | 2/1996 | Bryant et al. | 257/529 |
| 5,729,041 | 3/1998 | Yoo et al. | 257/529 |
| 5,760,453 | 6/1998 | Chen | 257/529 |
| 5,834,824 * | 11/1998 | Shepherd et al. | 257/530 |
| 5,949,127 * | 9/1999 | Lien et al. | 257/529 |

* cited by examiner

*Primary Examiner*—Phat X. Cao
(74) *Attorney, Agent, or Firm*—Skjerven Morrill MacPherson, LLP

(57) ABSTRACT

In a multi-level interconnect structure, a fusible material fills an opening in an isolation layer disposed between two interconnect levels or between an interconnect level and a device layer. The opening which may be, for example, a contact hole or a via, may be fabricated using processes generally used to fabricate normally sized vias and contact holes. The opening has a cross-sectional area A reduced by a factor of x relative to normally sized openings. Because the fusible interlevel interconnection has a reduced cross-sectional area, a programming current develops a destructive programming current density within fusible interlevel interconnection while current densities in coupled conductors, including normally sized vias and contacts, remain within long term reliability limits. Read/write circuitry connected to the fusible interlevel interconnection supports the programming current and supports a read current. The read current is regulated such that a responsive current density in a nonprogrammned fusible interlevel interconnection does not exceed long term reliability limits.

11 Claims, 5 Drawing Sheets

ELECTRICALLY PROGRAMMABLE INTERLEVEL FUSIBLE LINK FOR INTEGRATED CIRCUITS

This is a divisional of application Ser. No. 08/870,333 filed Jun. 6, 1997, now U.S. Pat. No. 5,949,127.

BACKGROUND OF THE INVENTION

1. Field of the Invention

This invention relates to semiconductor integrated circuits and more particularly to programmable fuse structures.

2. Description of the Related Art

Programmable circuits are well-known and incorporate a variety of programmable elements. One such programmable element is a fusible link whose conductivity is selectively altered. Fusible links are usually portions of a conductive layer which are unable to carry as much current as the remainder of the layer. In an unprogrammed state, the fusible link conducts with a very low impedance, approximately 2–6 ohms for metal fusible links, and serves as a low impedance current path between conductive bodies. In a programmed state, the fusible link becomes a virtual open circuit.

Fusible links are programmed in a number of different ways. For example, laser beams may effectively destroy and thus program selected fusible links. Additionally, programming circuitry may apply a voltage across a selected fusible link to produce a programming current in the fusible link sufficiently large to destroy the fusible link with time. Although some electrically programmed fusible links are recoverable by, for example, application of ultraviolet light, other fusible links are intended to be nonrecoverable, i.e. intended to be permanently nonconductive.

Fusible links may be used in conjunction with different types of integrated circuit structures. A fusible link such as fusible link 100, illustrated in a top plan view in FIG. 1, labeled prior art, includes a conductive layer 102 which provides a low impedance current path between vias 104 and 106. Conductive layer 102 includes a narrowed region or neck 108 where current density (i.e., current per unit area) increases relative to adjacent portions of conductive layer 102. A properly fabricated narrowed region 102 conducts a nondestructive current in normal operations, such as a memory read operation. However, during programming, a programming voltage applied across vias 104 and 106 produces sufficiently high programming current density in neck 108 to melt neck 108 and create an open circuit between vias 104 and 106.

Although fusible link 100 is well-known, a number of disadvantages exist relating to, for example, the ability to repeatedly fabricate the link, the ability to scale down the link to small geometries, the predictability of link performance, the large current required to program the link, and the ability to achieve desired packing densities with the link. For example, the formation of fusible link 100 generally requires a large number of process steps. These steps include depositing an oxide layer on a substrate (not shown), depositing conductive layer 102 such as metal or polysilicon on the oxide layer, patterning conductive layer 102 to form the neck 108, depositing an interlevel dielectric (not shown) over the patterned layer 102, forming vias 104 and 106 in the interlevel dielectric, filling vias 104 and 106 with a metal from a metal layer formed over the interlevel dielectric, and patterning the metal layer (not shown) to form interconnects. In all, fabrication of fusible link 100 typically requires at least seven generalized, well-known steps. Additionally, the ability to scale down the size of fusible link 100 is constrained by, for example, a design rule requiring sufficient pitch, i.e. the width of conductive layer 102 plus spacing to adjacent conductors. Current processing operation limitations substantially limit pitch reductions. Furthermore, decreasing geometries increase the difficulty of reliably reproducing neck 108 to consistent parameters, which can lead to unpredictable operation. The integrity of neck 108 is necessary for normal operations, and an unintended disruption of current flow through fusible link 100 due to an unexpectedly small neck unexpectedly open-circuiting can result in failure of an entire circuit. Additionally, the programming current may unexpectedly fail to open circuit an unexpectedly large neck. Thus to assure programming, the programming current is generally increased to compensate for variations in neck 108 geometry. Moreover, the layout and chip area required by fusible link 100 adversely impact component packing densities.

Other fuse structures have been proposed such as the fuse structure in Crafts et al., U.S. Pat. No. 5,376,820. Crafts et al forms a junction between a normally sized aluminum via and a polysilicon layer. The polysilicon layer and via material conduct a limited current below the current necessary to internally melt the via. However, the polysilicon layer, having a high impedance relative to the via material, acts as a heating element and melts the aluminum via material at the junction to sever any connections between the via and the polysilicon layer. Additionally, Crafts et al. protects other vias from the current density needed to heat the polysilicon layer by providing parallel current paths into the polysilicon layer and a single path out through the junction.

Conventionally, filled vias and contact holes are sized to provide permanent conductive interconnections between conductors on different integrated circuit layers. Current supply circuitry is not designed to supply current sufficient to destroy a conventionally filled via or contact hole without unacceptably increasing the risk of damage to other conducting conductors and other adjacent structures.

SUMMARY OF THE INVENTION

The present invention, in one embodiment, provides a reliable fuse structure which, for example, may be fabricated with minimal process steps having sufficiently small dimensions and orientation to offer relatively high packing densities. Pitch constraints associated with conductive layers are generally inapplicable as the fusible interlevel interconnection may be narrower than associated overlying and underlying conductors. Additionally, embodiments of the present invention support repeatability and scalability of fabrication processes, predictability of programming currents, and relatively low programming currents. In one embodiment, an interlevel opening, such as a via or contact hole disposed within an isolation layer and between conducting layers, is filled with conductive material to form a programmable interlevel interconnection. Adjacent structures and associated current carrying structures including nonprogrammable filled vias and contact holes are sufficiently robust to conduct without being damaged by a programming current.

This may be achieved by, for example, reducing the current carrying capacity of the filled interlevel opening by using "undersized" dimensions. Although the programmable interlevel interconnection is undersized, normal operational current densities incurred, for example, during read operations, are intentionally limited to an acceptable level for long-term operational reliability. Also, because of undersized dimensions, programming currents sufficient to elevate current density in the programmable interlevel interconnection to destroy the fusible interlevel interconnection are ineffective to damage adjacent structures or associated current carrying structures. Current densities in "normally" sized conductors are kept at a reliable, long-term current density level.

The present invention, in another embodiment, includes a first conductor of an integrated circuit, a second conductor, and an isolation layer disposed between the first conductor and the second conductor, the isolation layer having an opening disposed through the isolation layer. A fusible interlevel interconnection, disposed in the opening, electrically connects the first and second conductors in a nonprogrammed state and electrically isolates the first and second conductors in a programmed state. The opening constrains and defines the cross-sectional area of the fusible interlevel interconnection so that a destructive programming current density may be developed within the fusible interlevel interconnection to program the fusible interlevel interconnection. In another embodiment the present invention further includes a third conductor, and a dielectric disposed between the second and third conductors, an interlevel conductor disposed between the second and third conductors and through the dielectric, the interlevel conductor having a cross-sectional area, generally orthogonal to any current flow, of A; wherein the fusible interlevel interconnection has a cross-sectional area, generally orthogonal to any current flow, defined in terms of A/x where x is greater than 1.75.

In accordance with one embodiment of this invention, a first conductor is formed on an integrated circuit, an isolation layer is formed over the first conductor, and an opening is formed through the isolation layer to the first conductor. The opening is filled with a fusible material to form a programmable interlevel interconnection capable of developing destructive programming current density within the fusible material from a programming current, and a second conductor is formed over the isolation layer to connect to the fusible material filling the opening.

In another embodiment, the present invention includes the steps of selecting a fusible interlevel interconnection for programming, wherein the fusible interlevel interconnection includes a cross-sectional area, generally orthogonal to current flow, which is constrained by an interlevel opening. The present invention further includes the steps of applying a programming voltage across the fusible interlevel interconnection, and developing a destructive programming current density in the fusible interlevel interconnection to program the fusible interlevel interconnection.

In another embodiment, an integrated circuit includes at least two conductive layers and an insulation layer between and separating said two conductive layers. The integrated circuit further includes a first via formed between said two conductive layers, said first via having a first area in plan view and containing a conductive material thereby to allow a current to flow between the two conductive layers, and a second via, said second via having a second area in plan view substantially less than said first area, said second area being such as to cause the current density in said second via in response to the application of a given current through said second via to exceed the current density at which the conductive material in said second via will open circuit while the same current through said first via will not cause said first via to open circuit.

BRIEF DESCRIPTION OF THE DRAWINGS

The same feature appearing in multiple figures has the same reference numeral.

FIG. 3b is a cross-sectional top view of the integrated circuit of FIG. 3a.

FIG. 3c is an isometric, cross-sectional view of the integrated circuit of FIG. 3a.

DETAILED DESCRIPTION OF THE PREFERRED EMBODIMENTS

The following description of the invention is intended to be illustrative only and not limiting.

Integrated circuits include memories, microprocessors, and field programmable gate arrays. These circuits are made using various technologies. For example, complimentary metal oxide semiconductor (CMOS) technology, bipolar technology, and a combination of bipolar and CMOS ("Bib CMOS") technologies often extensively use multilevel interconnect structures. Interlevel electrical connections in multilevel interconnect structures are facilitated by openings extending through isolation layers which separate conductors on different levels. The term "conductor" is used herein to encompass all conducting, noninsulative materials including semi-conductor materials, metals, metal alloys, and other conductive elements and compounds. These openings include contact holes and vias. Contact holes generally connect conductive device regions or polysilicon layers with a first metal layer. Vias, disposed in intermetal isolation layers, generally connect conductive layers such as the first and second conductive layers, the second and third conductive layers, and so forth.

Current density (J) is generally defined as current per unit area (I/A). If current density in a conducting structure exceeds a predetermined threshold over a period of time, the structure may be damaged or destroyed. Referring to the top plan view of FIG. 2, labeled prior art, conventional interlevel interconnect 202 of multilevel interconnect 200 has a square cross-sectional defined in terms of an outer dimension d. Normally, when current flows through interlevel interconnect 202, current flows generally orthogonal to the cross-sectional area defined by d. Conventionally, dimension d is predetermined to provide a robust connection such that connected current supply circuitry (not shown) will not supply a current sufficient to generate a destructive current density in conventional interlevel interconnect 202. Conventional interlevel interconnect 202 is designed with dimension d to be a robust structure over all operational current ranges. In metal and metal alloys, a maximum operating current density of 2 ma/$\mu$m$^2$ is typically considered to be the limit for long-term, reliable operation. Thus, in metals and metal alloys, interlevel interconnect 202 is designed with a dimension d and a cross-sectional area equal to $(d)^2$ which prevent current densities above two milliamperes per square micron (2 ma/$\mu m^2$). Thus, by sizing the interlevel interconnect to ensure that the current densities through the interconnect are below the maximum acceptable current density, an uninterrupted low impedance current path reliably extends through interlevel interconnect 202 to underlying conductive layer 204.

Figure 1:
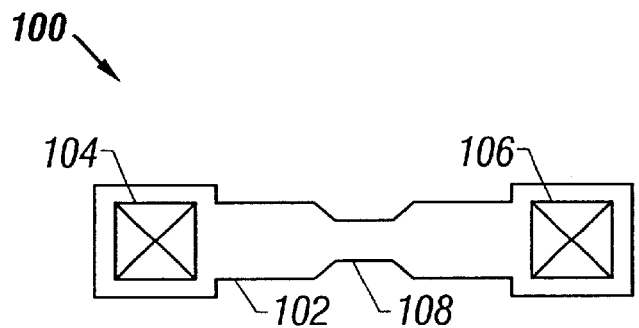
FIG. 1 is a top plan view of a prior art fusible link having a conductive layer and narrowed region.
Figure 2:
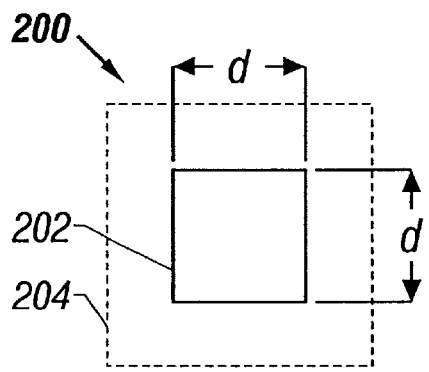
FIG. 2 is a top plan view of a prior art multilevel interconnect structure having a normally dimensioned interlevel interconnect.

Referring to FIGS. 3, 3a, 3b, and 3c, the cross-sectional area of fusible interlevel interconnection 302 is deliberately undersized by, for example, reducing dimension d, referenced in FIG. 2, by an appropriate factor of x. By reducing the cross-sectional area of fusible interlevel interconnection 302 to $(d/x)^2$, an applied current I produces a current density J equal to $I/(d/x)^2$ in fusible interlevel interconnection 302 which is $x^2$ times the current density produced by current I in interlevel interconnect 202. Thus, by reducing the cross-sectional area A of fusible interlevel interconnection 302, a smaller current I produces a sufficient current density within fusible interlevel interconnection 302 to program fusible interlevel interconnection 302. The fusible interlevel interconnection 302 of fusible link 300 may programmably interconnect any of a variety of underlying conductors 303, such as source/drain region 304, and overlying conductors such as metal 320.

Figure 3:
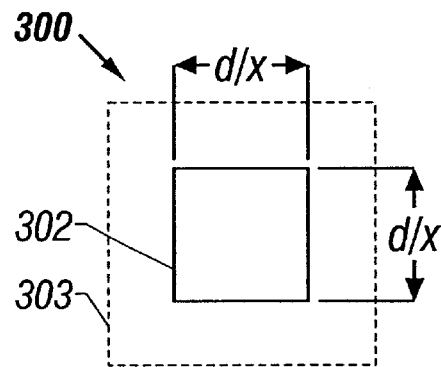
FIG. 3 is a top plan view of a fusible link, in accordance with this invention, having an undersized fusible interlevel interconnection.
Figure 3A:
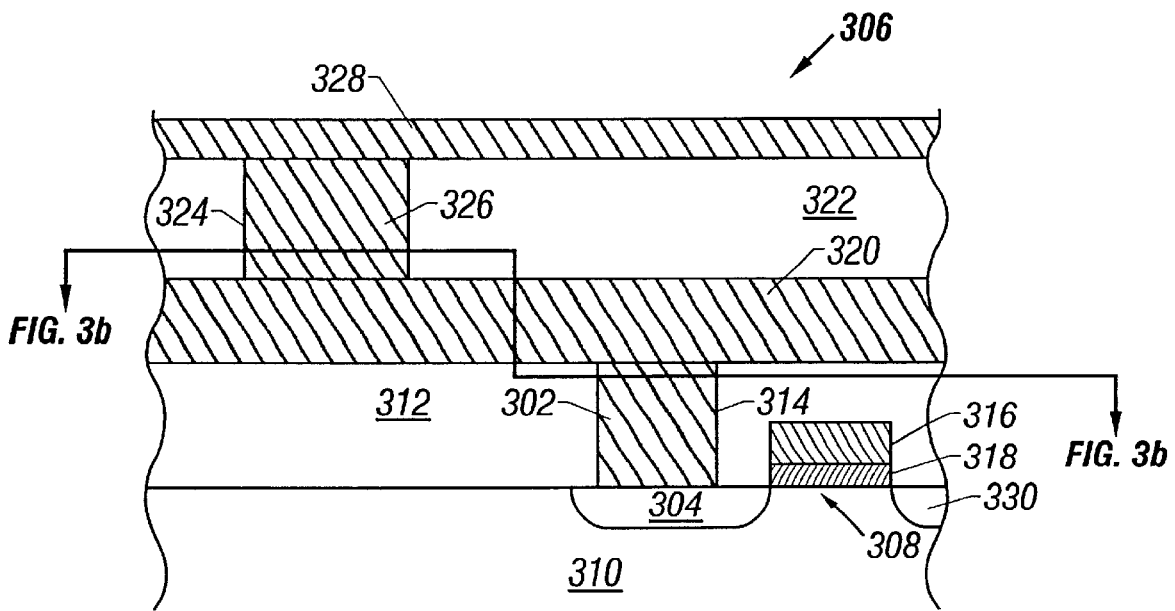
FIG. 3a is a cross-sectional side view of an integrated circuit having a via of FIG. 2 and a fusible link of FIG. 3.

Referring to FIG. 3a, fusible link 300 is incorporated into integrated circuit 306. A straight forward fabrication process provides integrated circuit 306 with a programmable multilevel interconnect structure having superb flexibility and high device density relative to conventional integrated circuits utilizing conventional fusible links and/or relatively complex fabrication processes. The gate 316 and gate dielectric 318 of circuit device 308, which in this embodiment is an insulated gate field effect transistor, are formed on semiconductor substrate 310, which is typically a doped silicon substrate. Field oxide 301 is formed on substrate 310, and a window is opened in field oxide 301 to fabricate circuit device 308. A gate oxide is grown on substrate 310 followed, in the same reactor, by a deposition of polysilicon. The polysilicon is selectively etched to form gate 316. The gate oxide is then etched, with gate 316 serving as a mask, to form gate dielectric 318. Next, N-type dopant impurities are implanted to form $n^+$ source 304/drain 330 while masking $p^+$ drain 330/source 304. Subsequently, P-type impurities are implanted to form $p^+$ drain 330/source 304 while masking $n^+$ source 304/drain 330. A well-known hydrofluoric acid dip operation removes any oxide formed on source 304 and drain 330 during the impurity implanting operations.

A dielectric layer 312, such as silicon dioxide, is blanket deposited to a thickness of about 0.2 $\mu m$ to 1.2 $\mu m$ for d/x equal to 0.7 $\mu m$. The thickness of dielectric 312 depends on the size of a fusible interlevel interconnection window 314 to be etched in isolation layer 312. Decreasing the thickness of isolation layer 312 generally allows further cross-sectional area A reduction, such as d/x reductions, while maintaining generally vertical fusible interlevel interconnection window 314 sidewalls through to substrate 310. After depositing isolation layer 312, photoresist (not shown) is patterned to expose an opening to isolation layer 312 corresponding to fusible interlevel interconnection window 314. Using the photoresist as a mask, an anisotropic reactive ion etch opens fusible interlevel interconnection window 314 through isolation layer 312 to substrate 310. Other etching technologies, such as a hydrofluoric acid (HF) wet etch, may also be used to open fusible interlevel interconnection window 314 in some embodiments of integrated circuit 306.

Subsequently, metal is deposited using, for example, well-known electron beam evaporation techniques, to fill fusible interlevel interconnection window 314 to form fusible interlevel interconnection 302. Metal 320, remaining on isolation layer 312 from the metal deposition process, is patterned using conventional techniques to form a conductive connection line, such as a write line or contact point. Thus, no additional steps beyond those required to produce a conventional contact are generally required.

Following patterning of metal 320, a second isolation layer 322 is blanket deposited over substrate 310, and a conventional via window 324 is opened. Via window 324 is filled with metal to form via 326, which in this embodiment is identical to interlevel interconnect 202. Via 326 has a cross-sectional area defined in terms of d, as referenced in FIG. 2. The remaining metal 328 is patterned using conventional techniques. Additionally, parallel conductive paths such as other generally normally sized vias (not shown), similar or identical to via 326, may couple a current path such as metal 328 to fusible interlevel interconnection 302.

Fusible interlevel interconnection 302 can be reliably and repeatably fabricated with a precisely defined cross-sectional area generally smaller than the cross-sectional area of neck 108. The undersized geometry of fusible interlevel interconnection 302, in relation to adjacent conductors such as underlying conductor 303 (FIG. 3) and overlying conductors (not shown), source/drain region 304, and the interlevel layout of fusible interlevel interconnection 302 generally does not restrict device packing densities.

Figure 3B:
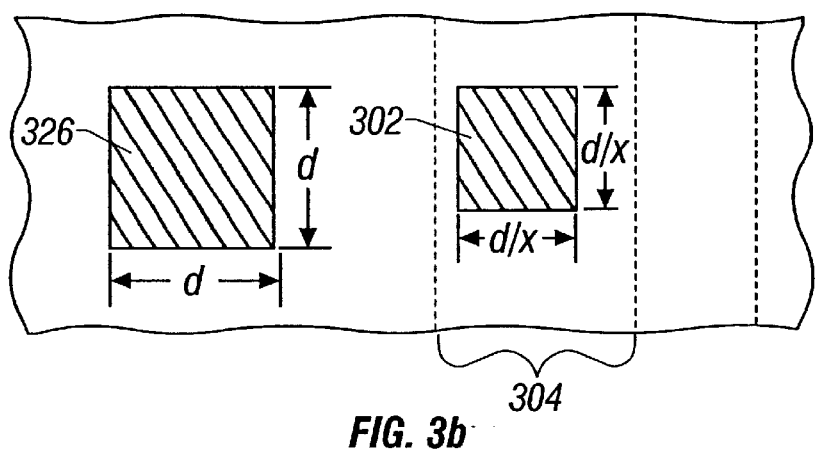
Figure 3C:
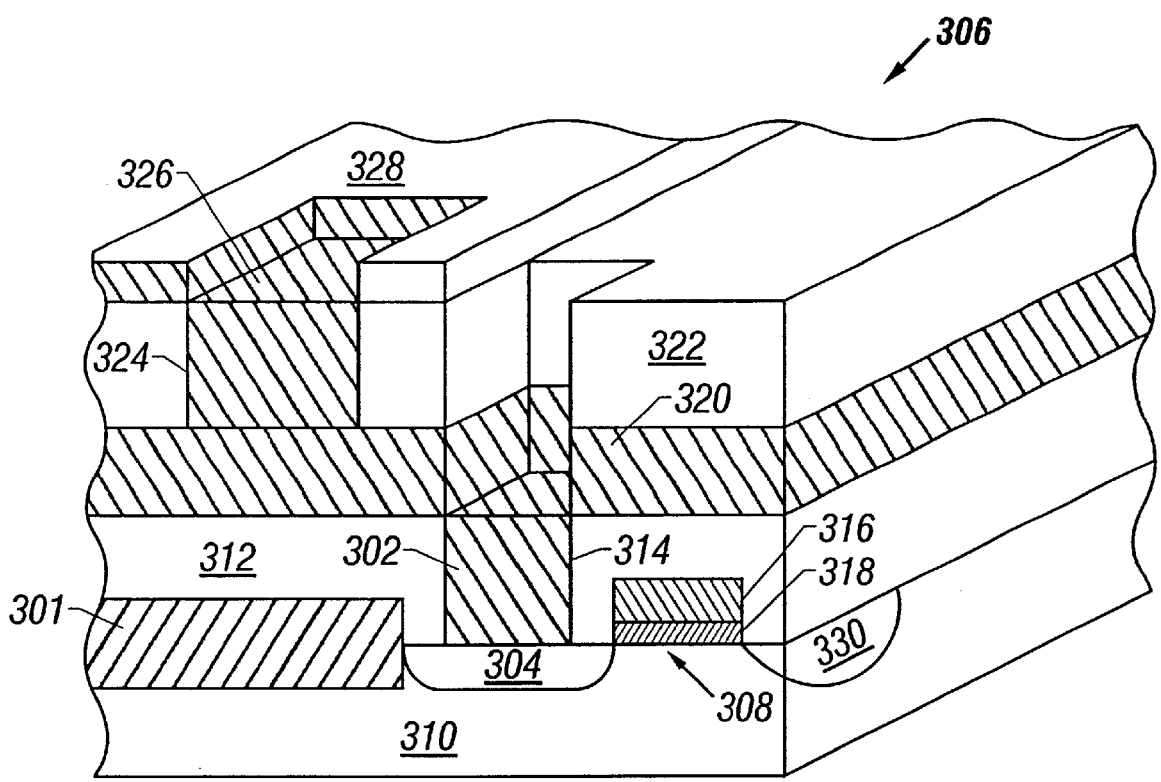

Referring to FIG. 3b, a cross-sectional top view of integrated circuit 306 shows the relative cross-sectional area dimensions of via 326 and fusible interlevel interconnection 302. FIG. 3c illustrates an isometric, cross-sectional view of integrated circuit 306. If circuit device 308 is turned ON so that current is conducted through a channel in substrate 310 between source/drain region 304 and source/drain region 330, current I is driven through metal 328, metal 320, fusible interlevel interconnection 302 to source/drain region 304. FIG. 3c shows an isometric view of this structure. All or only a portion of current I flows through via 326. The portion of current I flowing through via 326 is preferably limited to a current level which maintains current density in via 326 at or below long-term reliable current density limits. The remaining portion of current I may flow through parallel conductive paths (not shown) which also preferably maintain current density levels at or below long-term reliable current density limits.

Current levels that produce a programming current level in fusible interlevel interconnection 302 without functionally damaging other structures are based upon the cross-sectional area of fusible interlevel interconnection 302. Smaller cross-sectional dimensions require smaller programming currents to generate a sufficient current density to destroy fusible interlevel interconnection 302. Smaller programming currents also increase the robustness of not-to-be-programmed interconnections and circuit elements. Fusible interlevel interconnection 302 is large enough to reliably conduct nonprogramming currents. With generally precise fabrication of fusible link 300, the nonprogramming currents are predictable and will not program fusible link 300 even over long times.

The dimension d/x of fusible interlevel interconnection 302 may be formed with accuracy using well-known contact hole and via fabrication techniques to ensure a reliable programmable interlevel interconnection with predictable programming parameters. These programming parameters derive at least in part from generally precise fabrication of fusible link 300 and fusible interlevel interconnection 302 in particular, and these predictable parameters include a predetermined programming voltage, programming current, and a programming time sufficient to destroy the fusible interlevel interconnection 302 without functionally damaging other structures.

For example, when the current I flows in integrated circuit 306, the current density $J_F$ in fusible interlevel interconnection 302 is $I/(d/x)^2$. In an unprogrammed state, fusible interlevel interconnection 302 will continue to reliably conduct current until current I is increased to generate a programming current density $J_F$. To program fusible interlevel interconnection 302, current I is increased to produce $J_F$ equal to 400 ma/$\mu$m$^2$ and fusible interlevel interconnection 302 will be rendered non-conductive (programmed) in approximately one millisecond to one second as described below. During programming of fusible interlevel interconnection 302, the current density in via 326, in any parallel conductive paths, and in other not-to-be programmed conductors is maintained within long-term reliable current density limits. Consequently, for a given current I, fusible interlevel interconnection 302 may be programmed while via 326 continues to reliably function as a low impedance path between metal 328 and metal 320. Various other cross-sectional area geometries may also be used for fusible interlevel interconnection 302 and via 326 to achieve the same results. For example, via 326 and fusible interlevel interconnection 302 may have generally cylindrical shapes with generally circular cross-sectional areas. Consequently, if the radius of via 326 equals r and the radius of fusible interlevel interconnection 302 equals r/x, $J_V$ equals ($I/(\pi r^2)$ * $x^2$ ma/$\mu$m$^2$ and $J_F$ equals ($I/(\pi r^2)$) ma/$\mu$m$^2$.

Assuming that fusible interlevel interconnection 202 and fusible interlevel interconnection 302 are similarly affected by current density, x is appropriately chosen so that when fusible interlevel interconnection 302 develops a destructive programming current density, via 326 as well as other integrated circuit 306 structures, such as circuit device 308, metal interconnect 328, and metal interconnect 320, robustly conduct the programming level current I without damaging integrated circuit 306. Additionally, current supplying circuitry such as read/write circuit 800 (FIG. 8) is designed to provide programming currents to destroy fusible interlevel interconnection 302.

Fusible link 300 may be used in a large variety of applications. For example, fusible link 300 may be fabricated in current paths of an integrated circuit having a microprocessor (not shown). The current paths, registers, and associated logic circuits may at least in part define, for example, various operating modes of the microprocessor. When not programmed, fusible link 300 reliably conducts nonprogramming currents. A programming operation supplies programming currents to fusible link 300, and destructive current densities develop over a selected time, such as a few milliseconds, to make fusible link 300 nonconductive. Consequently, circuitry in the integrated circuit is altered which in turn alters, for example, the operating mode of the microprocessor.

Figure 4:
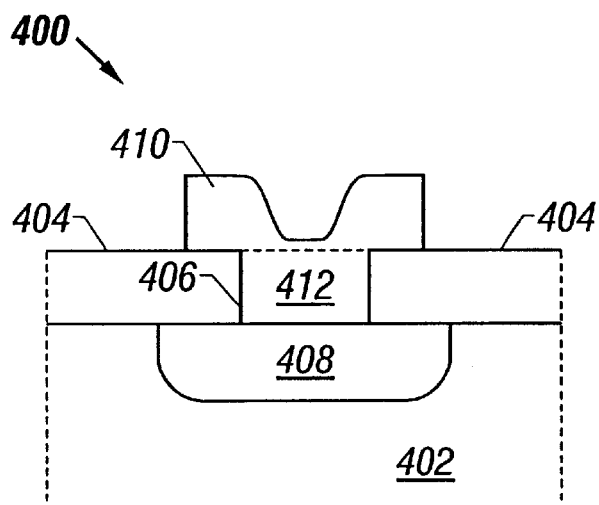
FIGS. 4 through 7 illustrate cross-sectional views of various embodiments and applications of the fusible link of FIG. 3.

FIGS. 4 through 7 illustrate side cross-sectional views of various embodiments and applications of fusible links. Fusible link 300 generically represents fusible links 400, 500, 600, and 700 and accordingly may be fabricated using any of the processes described below. In FIG. 4, fabrication of fusible link 400 with well-known technologies begins by forming a dielectric isolation layer of silicon dioxide 404 on silicon substrate 402. Typically, the thickness of dielectric 404 is approximately 0.6 $\mu$m for d/x equal to 0.7 $\mu$m, but the thickness may range down to 0.21 $\mu$m, for example. Decreasing d/x may require decreasing the thickness of dielectric 404 to allow fabrication of opening 406 having dimension d/x. The thickness of layer 404 depends on being able to fabricate opening 406 through dielectric 404 so that the side walls of opening 406 are generally vertical. Generally, opening 406 is formed as described above in conjunction with fusible interlevel interconnection window 314 to produce a generally vertical walled opening 406. In this embodiment, opening 406 is a contact hole having a lateral cross-sectional area defined in terms of the dimension d/x, as shown in FIGS. 3 and 3b.

After patterning dielectric 404, an implanting operation creates an n-doped device region 408, and a well-known HF dip operation removes any oxide formed in opening 406 during the implanting operation. Subsequently, deposition of metal 410, using, for example, well-known electron beam evaporation techniques, fills opening 406 to form fusible interlevel interconnection 412. Patterning of metal 410 forms a conductive connection line, such as a write line, or contact point. Thus, no additional steps beyond those required to produce a conventional interlevel interconnect such as multi-level interconnect 200 are required.

Figure 5:
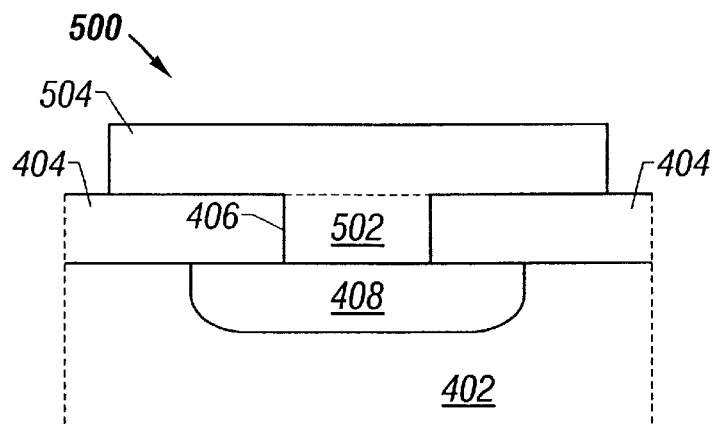

Referring to FIG. 5, fabricating fusible link 500 begins with the same process described in conjunction with fusible link 400 (FIG. 4) through formation of opening 406. Subsequently, a fusible interlevel interconnection 502 is formed by depositing a plug of, for example, SiAlCu, to fill contact hole opening 406. Well-known chemical mechanical polishing techniques planarize the upper surface of fusible interlevel interconnection 502 to create a flush interface with subsequently deposited metal 504. Patterning metal 504 forms a conductive line, such as a write line, or contact point.

Figure 6:
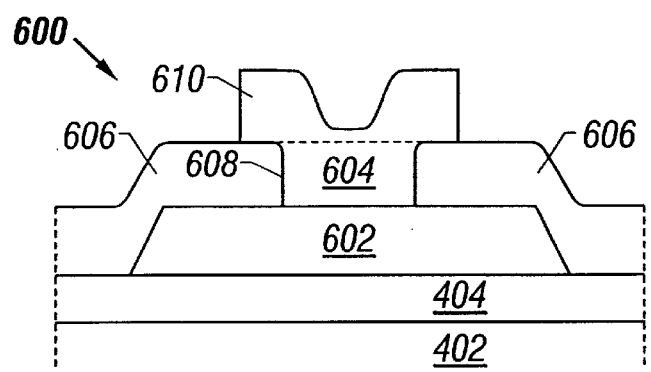

Referring to FIG. 6, fabricating fusible link 600 begins with formation of silicon oxide dielectric isolation layer 404 on silicon substrate 402. Deposition and subsequent patterning of metal 1 layer 602 forms a conduction path over dielectric 404. After forming metal 1 layer 602, an intermetal silicon dioxide dielectric 606 is vapor phase deposited and subsequently patterned to form a generally vertical walled opening 608 as described in conjunction with patterning and etching dielectric 404. In this embodiment opening 608 is a via having a lateral cross-sectional area defined in terms of dimension d/x, as shown in FIG. 3. Subsequently, deposition of metal 610 fills opening 608 to form fusible interlevel interconnection 604, and patterning of metal 610 forms a conductive connection line, such as a write line, or contact point.

Figure 7:
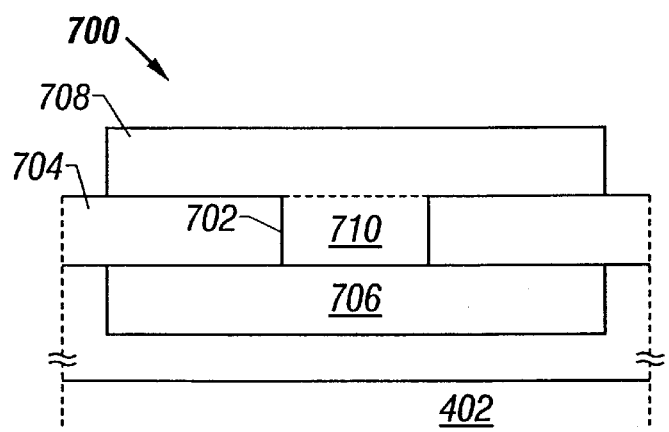

Referring to fusible link 700 of FIG. 7, a generally vertical walled undersized via opening 702, having a lateral cross-sectional area defined in terms of dimension d/x as shown in FIG. 3, is formed in previously fabricated silicon dioxide intermetal dielectric 704 as described in conjunction with dielectric 404 and opening 406. Opening 702 communicates between underlying, deposited and patterned bottom metal 706 and overlying, deposited and patterned top metal 708. A plug is deposited and planarized, as described in conjunction with fusible link 500 and fusible interlevel interconnection 502 (FIG. 5), to form fusible interlevel interconnection 710. Intervening layers may be formed between bottom metal 706 and silicon substrate 402.

Figure 8:
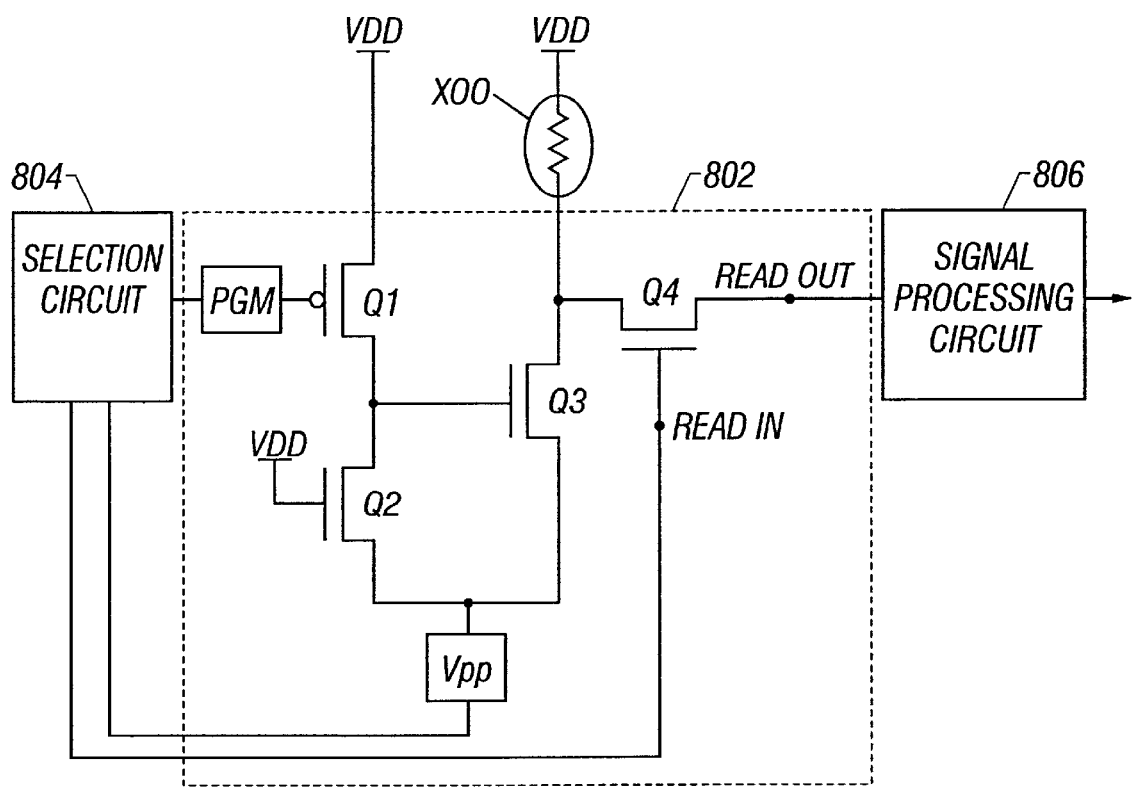
FIG. 8 is a schematic diagram including a read/write circuit for reading and programming the fusible links of FIGS. 3 through 7.

The fusible links of FIGS. 3 through 7 are generally used in conjunction with read/write circuitry such as the exemplary read/write circuit 802 illustrated schematically in FIG. 8. Read/write circuit 802 is connected to fusible link X00 which respectively could be any one of the fusible links in FIGS. 3 through 7 i.e. fusible link 300, fusible link 400, fusible link 500, fusible link 600, and fusible link 700.

Initially, fusible link X00 is in an unprogrammed state and, thus, conductive. During a read operation of unprogrammed fusible link X00, a well-known selection circuit 804 selects read/write circuit 802 by energizing, with a program signal, the program node PGM to a supply voltage of VDD, which in this embodiment is five volts (+5 V). Selection circuit 804 also establishes variable voltage node Vpp at a ground potential, which in this embodiment is zero volts (0 V). Selection circuit 804 generally includes decoder circuitry coupled via a bus to a processor which is connected to a memory (not shown). The program node PGM is a portion of a larger write line (not shown) of an integrated circuit.

The source of p-channel metal oxide semiconductor field effect transistor (MOSFET) Q1 is connected to supply voltage node VDD, and the drain of Q1 is connected to the gate of n-channel MOSFET Q3 so that Q3 functions as a switch between supply voltage node VDD and the gate of Q3. During the read operation, selection circuit 804 drives the program node PGM connected to the gate of Q1 to VDD (+5 volts) to turn Q1 off (nonconductive) and isolate the gate of Q3 from supply voltage node VDD. A gate and source of n-channel MOSFET Q2 are coupled to supply voltage node VDD and Vpp, respectively, which turn Q2 on (conductive) and couple the gate of Q3 to approximately Vpp. A source of Q3 is coupled to Vpp; thus, Q3 is turned off and isolates fusible link X00 from Vpp. At virtually the same time, selection circuit 804 energizes, with a read signal, the READ IN node (i.e. the gate of n-channel MOSFET Q4) to at least VDD. Unprogrammed fusible link X00 presents a low impedance current path, typically 2–6 ohms, between supply voltage node VDD and the drain of Q4. A source of Q4 is coupled to output node READ OUT and consequently Q4 turns on and functions as a pass switch to couple VDD to output node READ OUT. Output node READ OUT applies a logic one (+3 V to +5 V) to an input node of a conventional signal processing circuit 806 having a sense amplifier coupled to output node READ OUT to detect the logic one.

During this read operation, nonprogrammed fusible link X00 reliably presents a low impedance current path between conductors of different levels such as metal 410 and device region 408. When a fusible interlevel interconnection of fusible link X00, respectively represented by, for example, fusible interlevel interconnections 302, 412, 502, 604, and 710, is a metal or metal alloy, such as Silicon-Aluminum-Copper (SiAlCu), nonprogramming current densities preferably do not exceed 2 ma/$\mu$m$^2$ which eliminates long-term reliability concerns such as electromigration. Current density developed in all features of fusible link X00 in response to the small read current remains below the maximum long-term, reliable current density levels.

Referring to FIG. 8, during a programming operation, read/write circuit 802 drives a programming current through fusible link X00 to render the fusible interlevel interconnection of fusible link X00 nonconductive or at least place fusible link X00 in a high impedance state. Selection circuit 804 energizes variable voltage node Vpp to minus five volts (−5 V) and provides a programming signal of zero volts (0 V) to program node PGM. Supply voltage node VDD remains at five volts (+5 V). Selection circuit 804 drives node READ IN to a low voltage which turns Q4 off and isolates fusible link X00 from output node READ OUT. With the supply voltage node VDD connected to the gate of Q2 and the variable voltage node Vpp at −5V connected to the source of Q2, Q2 turns on. The programming voltage on program node PGM turns Q1 on. Q1 and Q2 form a voltage divider, and a potential greater than Vpp plus Vgs of Q3 develops on the Q3 gate. The variable voltage node Vpp at −5V is connected to the source of Q3, and Q3 turns on pulling a programming current through fusible link X00 with an initial potential drop approaching VDD minus Vpp, i.e. ten volts (+10 V). Q3 is sized so that the programming current density in fusible link X00 exceeds the maximum, long-term, reliable current density by a predetermined amount sufficient to predictably destroy the fusible interlevel interconnection of fusible link X00 such as fusible interlevel interconnection 302. Q3 sizing also prevents the programming current from developing a current density in any other associated conductor such as metal 302 and source/drain region 304 and conductor 303 in excess of the maximum, long-term, reliable current density of the associated conductors.

The programming current causes a high programming current density within the fusible interlevel interconnect of fusible link X00. Typically, a programming time of only a few milliseconds is required to program fusible link X00, which has a fusible interlevel interconnection such as 302. Pulsing the programming current in a well-known manner may decrease the programming time. Although a high programming current density is developed in the fusible interlevel interconnection, cross-sectional geometries of other current carrying conductors are large enough so that low, nondestructive current densities are established in the other conductors during programming. Exemplary low programming currents for a cross-sectional area d/x equal to $(0.5)^2$ $\mu$m$^2$ and $(0.75)^2$ $\mu$m$^2$ are 100 ma and 225 ma, respectively.

For metals and metal alloys, a predetermined programming current density of (400 ma/$\mu$m$^2$) (i.e. 200 times the 2 ma/$\mu$m$^2$ long-term, reliable, nonprogramming current density) is sufficient to predictably and quickly destroy fusible link X00. The high programming current density generated from a relatively low programming current places fusible link X00 in a nonconductive or high impedance, programmed state by, for example, melting (i.e. thermally destroying) or oxidizing the fusible interlevel interconnection of fusible link X00 as described below in conjunction with fusible interlevel interconnection 302. After completing a programming operation, selection circuit 804 drives variable voltage node Vpp to the reference voltage (0 V).

After programming, reading programmed fusible link X00 determines whether the fusible link X00 is in a programmed or unprogrammed state. This read operation commences as described above; however, because a programmed fusible link X00 is nonconductive and Q3 is turned off, output node READ OUT essentially has no charge. Output node READ OUT thus applies a logic zero (0 to +2 V) to an input node of signal processing circuit 806.

Referring to FIGS. 4 and 8 and assuming fusible link X00 is fusible link 300, during programming fusible interlevel interconnection 302 initially conducts the programming current. Programming current initially flows generally perpendicularly to the cross-sectional area (d/x)$^2$ of fusible interlevel interconnection 412 which is constrained by fusible interlevel interconnection window 314. The programming current and cross-sectional area of fusible interlevel interconnection 302 cause a high programming current density in fusible interlevel interconnection 302 sufficient to program fusible interlevel interconnection 302. The programming current density in the undersized fusible interlevel interconnection 302 preferably exceeds a long-term, reliable current density by a factor of 200 times or more and is approximately 400 ma/$\mu$m$^2$ for a metal or metal alloy fusible interlevel interconnection 302. The high programming current density causes fusible interlevel interconnection 302 to heat which in turn increases the resistance of fusible interlevel interconnection 302 causing fusible interlevel interconnection 302 to heat further. If fusible interlevel interconnection 302 consists of a SiAlCu, Al, or Al alloy, as the temperature of interconnection 302 increases, the material of interconnection 302 will draw upon any oxidizing species in isolation layer 312, such as oxygen from silicon oxide dielectric 312, and begin oxidizing. The resistance of an oxidizing fusible interlevel interconnection 302 further increases causing further temperature increases and more rapid oxidation and heating. Finally, fusible interlevel interconnection 302 is rendered nonconductive by oxidation and breaks the current path between metal 320 and source/drain region 304. Alternatively, fusible interlevel interconnection 302 is thermally destroyed by the programming current and increasing temperature to, for example, combust, and become nonconductive. With fusible interlevel interconnection 302 destroyed, a high impedance circuit exists between supply voltage node VDD and output node READ OUT. This programming mechanism also works with fusible link 400, fusible link 500, fusible link 600, and fusible link 700.

FIGS. 3, 3a, 3b, 3c, and 4–7 illustrate only a few of many possible uses and configurations of fusible interlevel interconnects. Many other variations will be evident to those of ordinary skill in the art. For example, referring to FIG. 3c, the roles of fusible interlevel interconnection 302 and via 326 may be reversed with via 326 being undersized by a factor of x relative to the area of interlevel interconnection 302 to be the fusible interlevel interconnection. In this role reversal, interlevel interconnection 302 becomes a normally sized contact.

While the invention has been described with respect to the embodiments an variations set forth above, these embodiments and variations are illustrative and not limiting. For example, it will be understood that particular physical characteristics and properties such as materials, conductivity types, dimensions, geometries, voltage levels, and current density levels are exemplary and others may be used. Although fusible interlevel interconnection 302 is shown as having a square cross-sectional geometry, it may have other cross-sectional shapes such as an approximately circular geometry. Additionally, fusible interlevel interconnection 302, fusible interlevel interconnection 412, fusible interlevel interconnection 502, fusible interlevel interconnection 604, and fusible interlevel interconnection 710 of FIGS. 3, 3a, 3b, 3c, 4, 5, 6, and 7, respectively, illustrate only exemplary embodiments. Those of ordinary skill in the art will recognize many other embodiments and applications. Accordingly, various other embodiments and modifications and improvements not described herein may be within the spirit and scope of the present invention, as defined by the following claims.

What is claimed is:

1. An apparatus comprising:
a first conductor of an integrated circuit;
a second conductor;
an isolation layer disposed between the first conductor and the second conductor, the isolation layer having an opening disposed through the isolation layer;
a fusible interlevel interconnection, disposed in the opening, electrically connecting the first conductor and the second conductor in a nonprogrammed state and electrically isolating the first conductor and the second conductor in a programmed state, the opening constraining the fusible interlevel interconnection so that a destructive programming current density may be developed within the fusible interlevel interconnection to place the fusible interlevel interconnection in the programmed state;
a via coupled to one of the first and second conductive layers;
a voltage node coupled to the first conductor;
a read/write circuit, coupled to the first conductor and the second conductor and the fusible interlevel interconnection, to supply a programming current from the voltage node through the first conductor and the second conductor and the fusible interlevel interconnection during a programming operation, wherein the programming current supports the destructive programming current density in the fusible interlevel interconnection and a nondestructive long-term, reliable current density in the via, wherein the read/write circuit includes a switch to couple the second conductor to an output node during a read operation, and, if the fusible interlevel interconnection is in the nonprogrammed state, a read current flows from the voltage node through the fusible interlevel interconnection to the output node, wherein the read current does not exceed a long-term, reliable current density in the fusible interlevel interconnection.

2. The apparatus as in claim 1 further comprising:
a selection circuit coupled to the read/write circuit; and
a signal processing circuit coupled to an output node of the read/write circuit.

3. The apparatus as in claim 1 further comprising:
a supply voltage node coupled to the first conductor; and
wherein the read/write circuit comprises:
a program node;
a programming voltage node;
a READ IN signal node;
a READ OUT signal node;
a first transistor having a first current terminal coupled to the supply voltage node, a control terminal coupled to the program node, and a second current terminal;
a second transistor having a first current terminal coupled to the first transistor second current terminal, a control terminal coupled to the supply voltage node, and a second current terminal coupled to the programming voltage node;
a third transistor having a first current terminal coupled to the second conductor, a control terminal coupled to the first transistor second current terminal, and a second current terminal coupled to the programming voltage node; and
a fourth transistor having a first current terminal coupled to the second conductor, a control terminal coupled to the READ IN signal node, and a second current terminal coupled to the READ OUT signal node.

4. The apparatus as in claim 1 wherein current levels for producing a programming current level in fusible interlevel interconnection are based on a cross-sectional area of the fusible interlevel interconnection.

5. The apparatus of claim 1 wherein the fusible interlevel interconnection and the via have reversed roles, the via being undersized relative to the fusible interlevel interconnection.

6. An integrated circuit comprising:
a first conductive layer disposed on a first level of the integrated circuit;

a second conductive layer;

an interlevel programmable interconnect disposed between the first conductive layer and the second conductive layer and, in a nonprogrammed state, having a generally uniform cross-sectional area, the programmable interconnect having the cross-sectional area for developing a current density within the programmable interconnect from a programming current to place the programmable interconnect in a programmed state and isolate the first conductive layer from the second conductive layer, and the programmable interconnect having the cross-sectional area for developing a long-term, reliable current density from a read current when the programmable interconnect, in a nonprogrammed state, conducts a nonprogramming current;

wherein when the first conductive layer and the second conductive layer conduct the programming current, the first conductive layer and second conductive layer respectively develop current densities which support long-term, reliable operation; and a read/write circuit, coupled to the programmable interconnect, for supplying the programming current and the read current, wherein the read/write circuit includes a switch to couple the second conductor to an output node during a read operation, and, if the programmable interconnect is in the nonprogrammed state, a read current flows from the voltage node through the programmable interconnect to the output node, wherein the read current does not exceed a long-term, reliable current density.

7. The integrated circuit of claim 6 wherein current levels for producing a programming current level in interlevel programmable interconnect are based on a cross-sectional area of the interlevel programmable interconnect.

8. An electronic system including a microprocessor, a memory, and a system bus, and further including a semiconductor device fabricated in accordance with a process comprising:

forming a first conductor of an integrated circuit;

forming an isolation layer over the first conductor;

forming an opening through the isolation layer to the first conductor;

filling the opening with a fusible material to form a programmable interlevel interconnection capable of developing a destructive programming current density within the fusible material from a programming current; and forming a second conductor over the isolation layer to connect to the fusible material filling the opening;

forming at least one via to couple a current to the programmable interlevel interconnection, wherein all or only a portion of the current flows through the via;

wherein the semiconductor device further includes a read/write circuit including a switch to couple the second conductor to an output node during a read operation, and, if the programmable interlevel interconnection is in the nonprogrammed state, a read current flows from the voltage node through the programmable interlevel interconnection to the output node, wherein the read current does not exceed a long-term, reliable current density in the via and the programmable interlevel interconnection.

9. An integrated circuit comprising:

a first conductive layer and at least a second conductive layer;

an insulation layer between and separating the first and second conductive layers;

a first via formed between the first and second conductive layers, the first via having a first area in plan view and containing a conductive material thereby to allow a current to flow between the first and second conductive layers;

a second via coupled to one of the first and second conductive layers, the second via having a second area in plan view substantially less than the first area, the second area being such as to cause the current density in the second via in response to the application of a given current through the second via to exceed the current density at which the conductive material in the second via will open circuit while the same current through the first via will not cause the first via to open circuit; and a read/write circuit, coupled to the first via and the second via, to supply a programming current from a voltage node through the first via and the second via during a programming operation, the read/write circuit including a switch to couple the second conductive area to an output node during a read operation, and, if the second via is in the nonprogrammed state, a read current flows from the voltage node through the second via to the output node, wherein the read current does not exceed a long-term, reliable current density in the first via and the second via.

10. The integrated circuit as recited in claim 9, wherein the read/write circuit supplies a programming that supports the destructive programming current density in the second via and a nondestructive long-term, reliable current density in the first via.

11. The integrated circuit as recited in claim 10, further comprising:

a selection circuit coupled to the read/write circuit; and a signal processing circuit coupled to an output node of the read/write circuit.

\* \* \* \* \*